United States Patent
Bang et al.

(10) Patent No.: US 7,205,205 B2
(45) Date of Patent: Apr. 17, 2007

(54) RAMP TEMPERATURE TECHNIQUES FOR IMPROVED MEAN WAFER BEFORE CLEAN

(75) Inventors: Won B. Bang, Santa Clara, CA (US); Yen-Kun Wang, Fremont, CA (US); Kevin Mikio Mukai, Santa Clara, CA (US); Theresa Marie O. Liu, Sunnyvale, CA (US)

(73) Assignee: Applied Materials, Santa Clara, CA (US)

( * ) Notice: Subject to any disclaimer, the term of this patent is extended or adjusted under 35 U.S.C. 154(b) by 0 days.

(21) Appl. No.: 10/712,464

(22) Filed: Nov. 12, 2003

(65) Prior Publication Data

US 2005/0101155 A1    May 12, 2005

(51) Int. Cl.
*H01L 21/76* (2006.01)
(52) U.S. Cl. .................................................. 438/404
(58) Field of Classification Search ............. 438/404
See application file for complete search history.

(56) References Cited

U.S. PATENT DOCUMENTS

| | | | | |
|---|---|---|---|---|
| 5,403,434 A | * | 4/1995 | Moslehi | 134/1.2 |
| 5,455,082 A | * | 10/1995 | Saito et al. | 427/542 |
| 5,785,796 A | * | 7/1998 | Lee | 156/345.24 |
| 6,066,519 A | * | 5/2000 | Gardner et al. | 438/197 |
| 6,218,268 B1 | * | 4/2001 | Xia et al. | 438/435 |
| 6,736,147 B2 | * | 5/2004 | Satoh et al. | 134/1.1 |

OTHER PUBLICATIONS

Sorab K. Ghandhi, "VLSI Fabrication Principles, Silicon and Gallium Arsenide", John Wiley & Sons, 1986, pp 377-383.*

* cited by examiner

*Primary Examiner*—W. David Coleman
(74) *Attorney, Agent, or Firm*—Townsend Townsend Crew, LLP

(57) ABSTRACT

A method of operating a substrate processing chamber comprising transferring a first substrate into the substrate processing chamber and heating the substrate to a first temperature of at least 510° C.; depositing an insulating layer over the first substrate while reducing the temperature of the substrate from the first temperature to a second temperature that is lower than the first temperature; transferring the first substrate out of the substrate processing chamber; removing unwanted deposition material formed on interior surfaces of the chamber during the depositing step by introducing reactive halogen species into the chamber while increasing the temperature of chamber; transferring a second substrate into the substrate processing chamber and heating the substrate to the first temperature; and depositing an insulating layer over the second substrate while reducing the temperature of the substrate from the first temperature to the second temperature.

29 Claims, 4 Drawing Sheets

RAMP TEMPERATURE TECHNIQUES FOR IMPROVED MEAN WAFER BEFORE CLEAN

BACKGROUND OF THE INVENTION

One of the primary steps in the fabrication of modern semiconductor devices is the formation of an insulating layer, such as a silicon oxide layer, on a substrate or wafer. Such insulating layers are used in the formation many different features in an integrated circuit including shallow trench isolation (STI) structures and premetal dielectric (PMD) layers among others. In both STI and PMD applications, the gapfill capability of the insulating layer is an important physical characteristic.

As is well known, one method for depositing silicon oxide and other insulating layers for STI and PMD applications is by chemical vapor deposition (CVD). In a conventional thermal CVD process, reactive gases are supplied to the substrate surface where heat-induced chemical reactions take place to form the desired film. In a conventional plasma CVD process, a controlled plasma is formed using, for example, radio frequency (RF) energy or microwave energy to decompose and/or energize reactive species in reactant gases to produce the desired film. Because of the importance of completely filling gaps, such as trenches in STI applications and gaps between adjacent raised surfaces in PMD applications, with the insulating film, such CVD operations, whether plasma and thermal, are often performed at substrate temperatures above 500° C.

Unwanted deposition on areas such as the walls of the processing chamber occurs during such CVD processes. As is known in the industry, it is common to remove the unwanted deposition material that builds up on the interior of chamber walls with an in situ chamber clean operation. Common chamber cleaning techniques include the use of an etchant gas, such as nitrogen trifluoride ($NF_3$), to remove the deposited material from the chamber walls and other areas. In some processes, the etchant gas is introduced into the chamber and a plasma is formed so that the etchant gas reacts with and removes the deposited material from the chamber walls. Such cleaning procedures are commonly performed between deposition steps for every wafer or every n wafers.

Many of the commercially available CVD chambers include aluminum, aluminum oxide and/or aluminum nitride components including chamber liners, substrate heater/pedestals and chamber walls among others. One potential problem in using $NF_3$ or other fluorine-including etchant gases for cleaning unwanted deposits from such aluminum or aluminum oxide chamber parts after a high temperature deposition process is that active fluorine species from the etchant gas may react with the aluminum resulting in the formation of AlO:F and/or $AlF_x$ films at the surface of the respective chamber parts. These films have relatively high vapor pressures and relatively low sublimation temperatures (e.g., the sublimation temperature of aluminum fluoride is approximately 600° C.) and can attain thicknesses of several hundred micrometers when conditions for self-passivation are not met. If a particular ceramic component (e.g., heater, electrostatic chuck, cover plate, etc.) is used above the sublimation temperature, the outer surface of the component is consumed during the process in which the AlO:F or $AlF_x$ film is formed. Furthermore, it has been observed, that under ion bombardment, an AlF film can be sputtered, even at temperatures less than 400° C. This phenomenon may result in recondensation of the byproducts on colder components (e.g., showerheads and chamber liners) and may lead to process drift and particle contamination in some substrate processing chambers.

One method of preventing such AlO:F and/or $AlF_x$ formation is to cool the chamber after the high temperature deposition process and prior to the cleaning process. For example, $AlF_x$ typically forms at 480° C. so cooling all the chamber components to a temperature significantly below 480° C. prior to the cleaning process should prevent $AlF_x$ formation. Cooling the chamber after the deposition process takes time, however, and also requires that the chamber be reheated back to an appropriate deposition temperature after the cleaning step adversely affecting wafer throughput. Accordingly, it can be appreciated that other techniques are desirable.

BRIEF SUMMARY OF THE INVENTION

Embodiments of the invention provide a high temperature deposition process suitable for depositing insulating layers into and filling high aspect ratio gaps combined with a cleaning sequence that minimizes $AlF_x$ formation on ceramic components of the deposition chamber. Some embodiments of the invention are particularly useful in depositing silica glass films for STI applications but embodiments of the invention may be used in other applications as well.

According to one embodiment of the invention a method of operating a substrate processing chamber is disclosed. The method comprises transferring a first substrate into the substrate processing chamber and heating the substrate to a first temperature of at least 510° C.; depositing an insulating layer over the first substrate while reducing the temperature of the substrate from the first temperature to a second temperature that is lower than the first temperature; transferring the first substrate out of the substrate processing chamber; removing unwanted deposition material formed on interior surfaces of the chamber during the depositing step by introducing reactive halogen species into the chamber while increasing the temperature of chamber; transferring a second substrate into the substrate processing chamber and heating the substrate to the first temperature; and depositing an insulating layer over the second substrate while reducing the temperature of the substrate from the first temperature to the second temperature. In some embodiments the second temperature is at least 30° C. lower than the first temperature and in other embodiments the second temperature is at least 50° C. lower than the first temperature.

According to another embodiment of the invention a method of operating a substrate processing chamber having a substrate heater is disclosed. The method comprises transferring a first substrate into the substrate processing chamber and heating the heater to a first set point that causes the substrate to be heated to a first temperature of at least 510° C.; depositing an insulating layer over the first substrate while reducing the temperature of the heater to a second set point thereby reducing the temperature of the substrate from the first temperature to a second temperature that is lower than the first temperature; transferring the first substrate out of the substrate processing chamber; removing unwanted deposition material formed on interior surfaces of the chamber during the depositing step by introducing reactive halogen species into the chamber while increasing the temperature of the heater from a third set point that is lower than the first set point to a fourth set point that is lower than the first set point; transferring a second substrate into the substrate processing chamber and heating the heater to the first set point substrate to the first temperature; and depositing an insulating layer over the second substrate while reducing the temperature of the substrate from the first temperature to the second temperature. In one particular embodiment the insulating layer is a silica glass deposited at a pressure of between about 45–700 Torr.

These and other embodiments of the invention along with many of its advantages and features are described in more detail in conjunction with the text below and the attached figures.

DETAILED DESCRIPTION OF THE INVENTION

Figure 1:
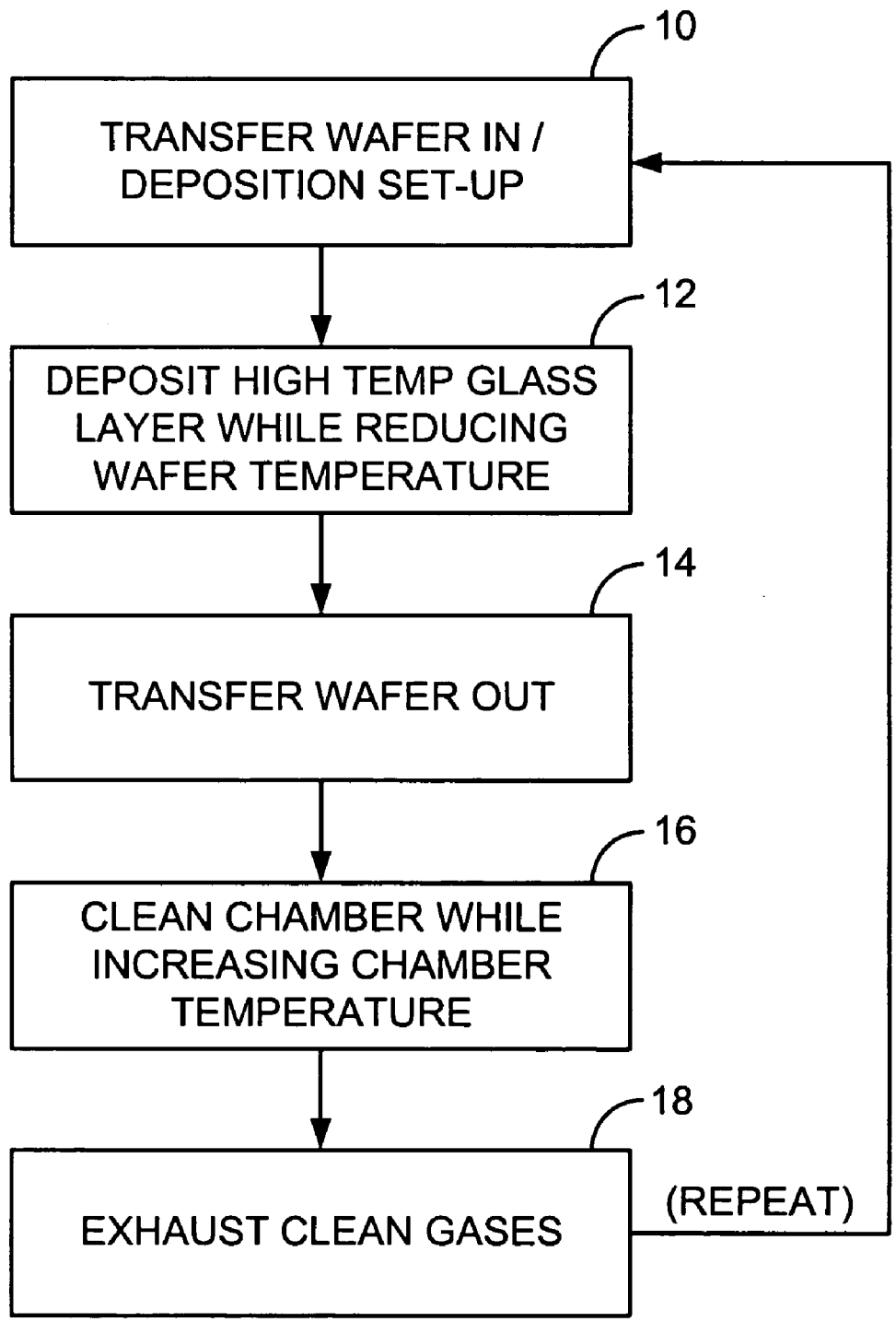
FIG. 1 is a flowchart illustrating the steps associated with one embodiment of the method of the present invention.

Embodiments of the invention provide for an improved high temperature deposition and subsequent chamber cleaning process. In order to better appreciate and understand the present invention, reference is first made to FIG. 1, which is a flowchart depicting the steps associated with one embodiment of the invention used to deposit a silica glass film. As shown in FIG. 1, the process starts by loading a substrate into a substrate processing chamber and initiating various pre-deposition set-up steps (step 10). In one embodiment the pre-deposition set-up steps include heating the substrate to a desired temperature, stabilizing the flow of one or more process gases and setting the pressure within the chamber to a desired pressure level.

After the deposition set-up sequence has been completed, deposition of the high temperature silica glass layer begins by flowing the deposition gases into the chamber to deposit the layer over the substrate (step 12). As used herein, a high temperature deposition process is a process in which the temperature of the substrate is at least 510° C. and in some embodiments the temperature of the substrate reaches at least 540° C. during the initial phase of the deposition process. For many applications such high temperature silica glass deposition processes are necessary in order to obtain film properties (e.g., gapfill properties) that are acceptable for the application.

Embodiments of the invention reduce the temperature of the substrate during the deposition step. In one particular embodiment that is particularly useful for STI and other high aspect ratio gapfill applications, the deposition gases include TEOS and ozone and the silica glass layer is deposited under SACVD deposition conditions as is known to those of skill in the art. In this embodiment, an initial thickness (first stratum) of the SACVD silica glass layer is formed at first temperature that results in a highly conformal layer (excellent gapfill) while the remainder of the layer (second stratum) is formed at a decreasing temperature that increases the deposition rate of the process while slightly reducing the film's conformality (gapfill capability). The first stratum partially fills the high aspect ratio gap and the second stratum layer completes the gapfill process. In one particular embodiment the first stratum fills between about 10 to 25 percent of the gap as measured from the bottom of the gap to the top.

Figure 2:
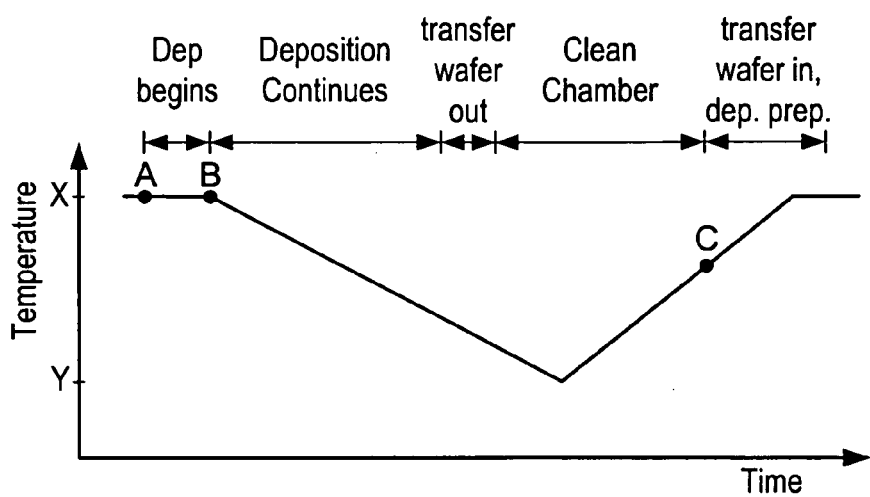
FIG. 2 is graph depicting a heating sequence according to one embodiment of the method depicted in FIG. 1.

FIG. 2 is a graph depicting a heating sequence according to one embodiment of the invention. As shown in FIG. 2, deposition step 20 includes a first substep where the deposition of the first stratum of the silica glass layer proceeds from time A at a relatively fixed temperature. Then, at time B, the temperature of the substrate is reduced over time from temperature X towards temperature Y while the second stratum of the silica glass layer is deposited. In the embodiment depicted in FIG. 2, some of this temperature reduction occurs after completion of the deposition process when the wafer is transferred out of the chamber and residual deposition gases are pumped out of the chamber (FIG. 1, step 14).

After the wafer is transferred out of the chamber, unwanted deposition material may be removed from some interior surfaces of the chamber by introducing reactive species formed from an appropriate halogen-containing gas (step 16). In one embodiment the reactive species are fluorine species that are dissociated in a plasma formed outside the substrate processing chamber from, for example, nitrogen trifluoride ($NF_3$).

Embodiments of the invention initiate the cleaning step at a temperature that is significantly reduced as compared to the highest temperature used during deposition step 12. The substrate is not in the chamber during the clean step so a direct comparison of substrate temperatures in the deposition and clean steps is not possible. In one particular embodiment, however, where the substrate is supported during deposition on a substrate support that transfers heat to the substrate, the temperature of the substrate support at the start of the clean step is reduced at least 30° C. as compared to the highest temperature of the substrate support during deposition step 12. And in other embodiments the temperature of the substrate support is reduced at least 50° C.

The reduction in temperature from the beginning of the deposition step to the start of the clean process can have a significant effect on the formation of $AlF_x$ particles within the chamber. The inventors have performed extensive studies on the formation of $AlF_x$ within chambers and have determined that significant $AlF_x$ will form within the chamber during a fluorine clean step when the temperature of the substrate support/heater is greater than 480° C. $AlF_x$ may still form at lower temperatures but the amount of such formation is minimal.

While it would be desirable to perform the entire clean process at a significantly reduced temperature to prevent $AlF_x$ formation altogether, substrate throughput would be greatly reduced. Generally speaking it takes time to cool the chamber from a temperature in the mid-500° C. range to a temperature below 480° C. and it also takes time to increase the temperature from a temperature in the mid-400° C. range to a temperature in the mid-500° C. range. Embodiments of the invention increase substrate throughput by beginning to increase the temperature of the substrate heater towards temperature X during the chamber cleaning process so that the temperature of a subsequent wafer transferred into the chamber can more quickly reach an appropriate deposition temperature.

In most embodiments of the invention the increase in chamber temperature step 16 does not return the temperature of the chamber back to a temperature sufficient to heat the substrate to temperature X (the temperature at which deposition step 12 begins). Instead after completion of the clean step, the temperature of the chamber is increased further while residual clean gases (e.g., reactive fluorine species) are exhausted from the chamber (step 18) by purging the chamber with a flow of one or more inert gases. The chamber temperature can also be increased further while a new substrate is transferred into the chamber and selected gas flows are stabilized in preparation of depositing a dielectric glass layer over the new substrate (step 10 repeated with the new substrate).

Figure 3A:
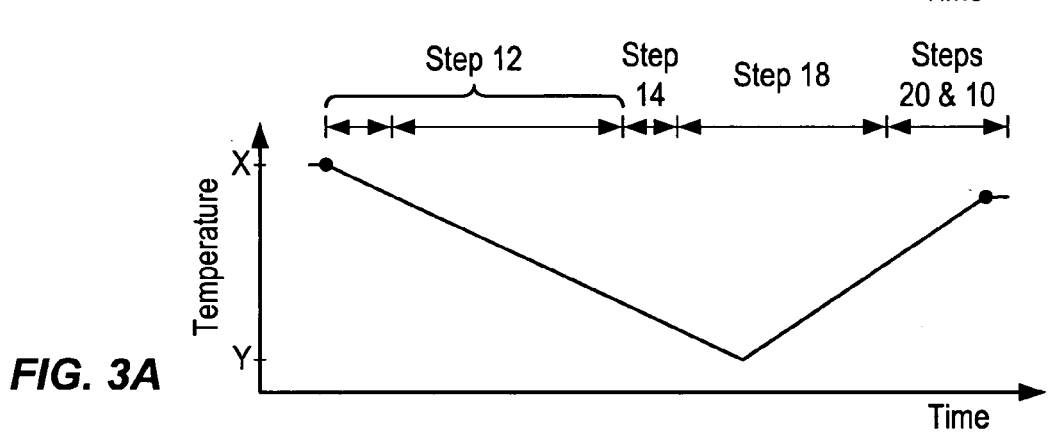
FIGS. 3A–3C are graphs depicting various alternative heating sequences according to other embodiments of the present invention.
Figure 3B:
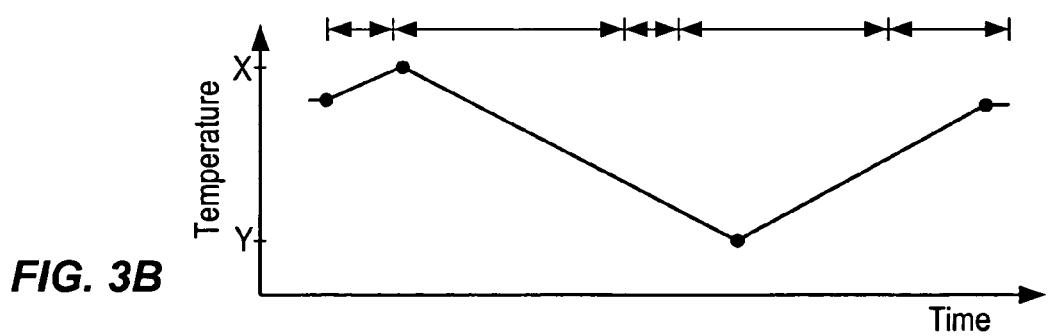
Figure 3C:
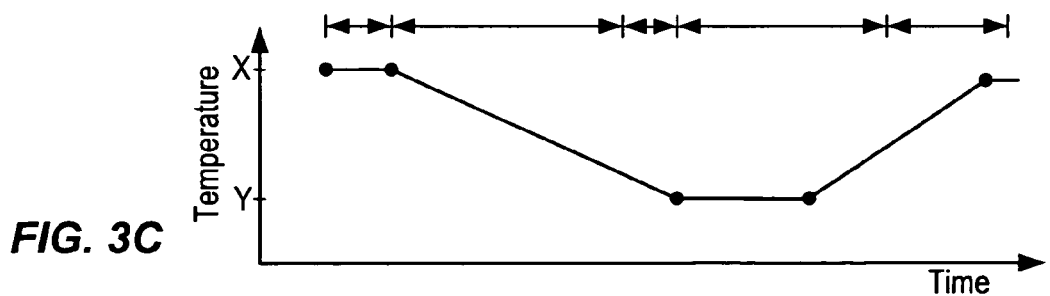

Embodiments of the invention are not limited to the particular heating sequence illustrated in FIG. 2. FIGS. 3A–3C illustrate several examples of additional heating sequences that are within the scope of the present invention. As shown in FIG. 3A in some embodiments of the invention the temperature of the substrate is gradually decreased from temperature X from the very beginning of deposition step 12 without the initial fixed temperature deposition phase shown in FIG. 2. In another embodiment shown in FIG. 3B the temperature of the substrate may actually be increased during an initial portion of deposition step 12 (e.g., deposition of a first stratum of the dielectric layer) and before being subsequently decreased towards temperature Y. Also, in some embodiments the temperature of the chamber is maintained at a relatively fixed temperature for a first portion of the chamber clean step prior to increasing the temperature of the chamber in the later stages of the cleaning step as shown in FIG. 3C. A person of skill in the art will recognize that FIGS. 2 and 3A–3C represent several examples of various heating sequences that can be employed in embodiments of the invention. The skilled artisan will appreciate that many other heating sequences may also be devised and employed.

In one particular embodiment of the invention, the substrate is loaded onto a ceramic substrate pedestal that includes an embedded resistive heater during step 10 and the heater is set to a temperature of at least 510° C. and preferably to a temperature of at least 540–600° C. The thermal transfer characteristics between the substrate and the substrate pedestal are such that the substrate is typically 10–15° C. lower in temperature than the pedestal in these temperature ranges. In some embodiments the temperature of the pedestal at the start of the clean step is at least 30° C. less than the highest temperature used during deposition step 12, while in other embodiments the temperature of the pedestal is at least 50° C. less than the highest temperature used during deposition step 12.

A temperature reduction of 50° C. or more can be achieved by turning the substrate heater off completely and allowing the pedestal to cool at the maximum rate dictated by the thermal characteristics of the pedestal. In embodiments that allow the substrate pedestal temperature to be decreased in this manner, the temperature of the chamber at the beginning of the chamber clean step can lower than it would be if the pedestal cooling process started after the deposition step for any given length intermediate step 14. The pedestal heater can then be turned back on during the cleaning step at the point in time where, when the temperature of the pedestal is increased at its maximum safe ramp rate, the pedestal can be heated to the temperature that ensures a substrate is heated to temperature X at the start of the next deposition cycle 10.

Figure 4A:
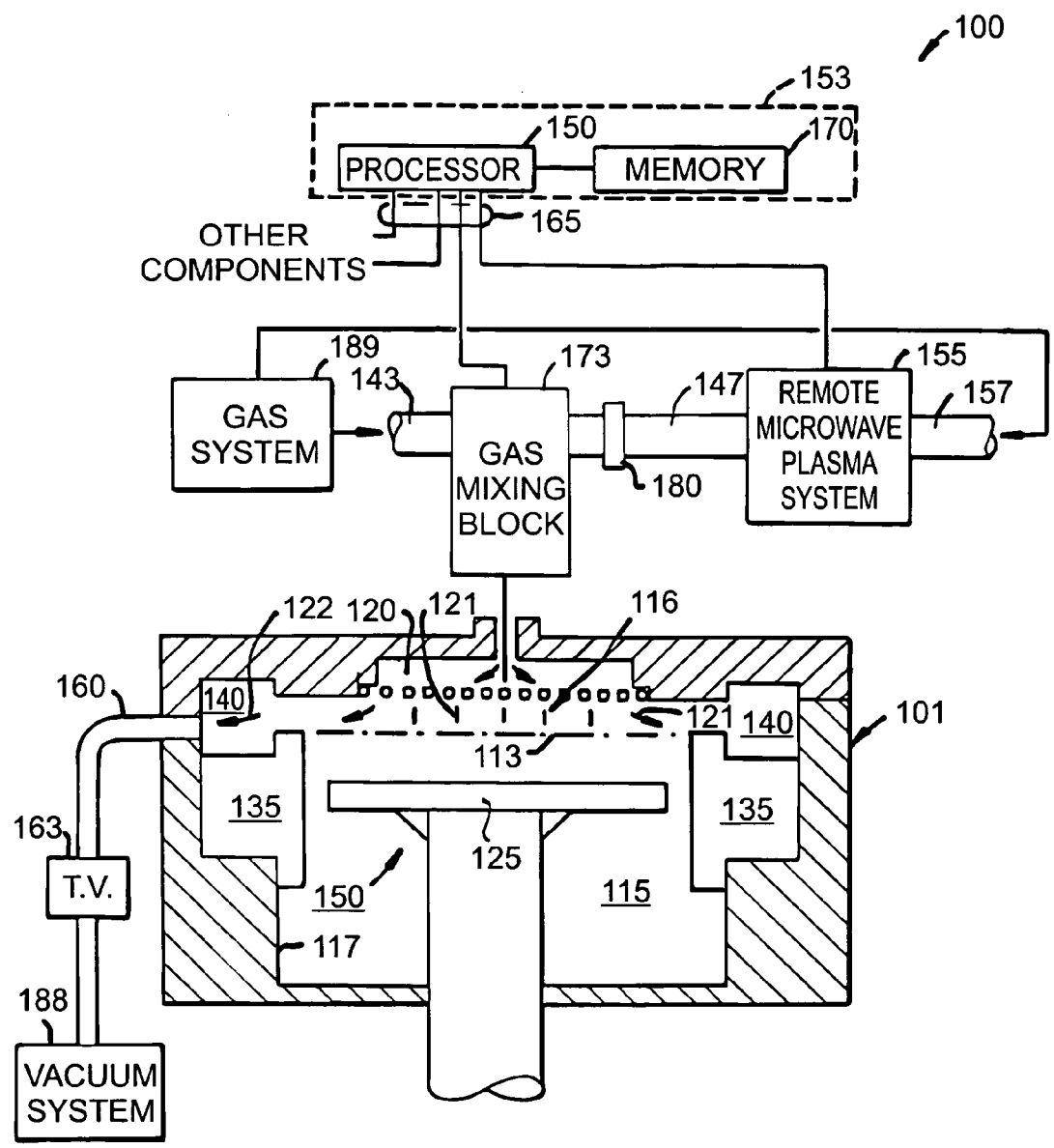
FIG. 4A is a simplified, cross-sectional view of an exemplary substrate processing system with which embodiments of the invention may be used.

FIG. 4A is a simplified diagram of an exemplary substrate processing system (also referred to as a chemical vapor deposition ("CVD") system0 100 that can be operated according to the method of the present invention. The system shown in FIG. 4A is suitable for performing thermal, sub-atmospheric CVD ("SACVD") processes, as well as other processes, such as reflow, drive-in, cleaning, etching, and gettering processes. Multiple-step processes can also be performed on a single substrate or wafer without removing the substrate from the chamber. The major components of the system include, among others, a vacuum chamber 115 that receives process and other gases from a gas delivery system 189, a vacuum system 188, a remote plasma system 155, and a control system 153. These and other components are described below in order to understand the present invention.

The CVD apparatus 100 includes an enclosure assembly 102 housing a vacuum chamber 115 with a gas reaction area 116. A gas distribution plate 120 is provided above the gas reaction area 116 for dispersing reactive gases and other gases, such as purge gases, through perforated holes in the gas distribution plate 120 to a wafer (not shown) that rests on a vertically movable heater 125 (also referred to as a wafer support pedestal). The heater 125 can be controllably moved between a lower position, where a wafer can be loaded or unloaded, for example, and a processing position closely adjacent to the gas distribution plate 120, indicated by a dashed line 113, or to other positions for other purposes, such as for an etch or cleaning process. A center board (not shown) includes sensors for providing information on the position of the wafer.

The heater 125 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 125 exposed to the vacuum chamber 115 are made of a ceramic material, such as aluminum oxide ($Al_2O_3$ or alumina) or aluminum nitride.

Reactive and carrier gases are supplied through the supply line 143 into a gas mixing box (also called a gas mixing block) 173, where they are preferably mixed together and delivered to the gas distribution plate 120. The gas mixing box 173 is preferably a dual input mixing block coupled to a process gas supply line 143 and to a cleaning/etch gas conduit 147. A valve 180 operates to admit or seal gas or plasma from the gas conduit 147 to the gas mixing block 173. The gas conduit 147 receives gases from an integral remote plasma system 155, which has an inlet 157 for receiving input gases. During deposition processing, gas supplied to the plate 120 is vented toward the wafer surface (as indicated by arrows 121), where it may be uniformly distributed radially across the wafer surface, typically in a laminar flow.

Purging gas may be delivered into the vacuum chamber 115 from the plate 120 and/or an inlet port or tube (not shown) through the bottom wall of enclosure assembly 102. The purging gas flows upward from the inlet port past the heater 125 and to an annular pumping channel 140. An exhaust system then exhausts the gas (as indicated by arrows 122) into the annular pumping channel 140 and through an exhaust line 160 to a vacuum system 188, which includes a vacuum pump (not shown). Exhaust gases and entrained particles are drawn from the annular pumping channel 140 through the exhaust line 160 at a rate controlled by a throttle valve system 163.

The remote plasma system 155 can produce a plasma for selected applications, such as chamber cleaning or etching native oxide or residue from a process wafer. Plasma species produced in the remote plasma system 155 from precursors supplied via the gas line 157 are sent via the conduit 147 for dispersion through the plate 120 to the vacuum chamber 115. Precursor gases for a cleaning application may include fluorine, chlorine, and other reactive elements. The remote microwave plasma system 155 also may be adapted to deposit plasma-enhanced CVD films by selecting appropriate deposition precursor gases for use in the remote microwave plasma system 155.

The control system 153 controls activities and operating parameters of the deposition system. Control system 153 includes a processor 150 and a memory 170. The processor 150 executes system control software, such as a computer program stored in memory 170, which is coupled to the processor 150. Preferably, the memory 170 may be a hard disk drive, but of course the memory 170 may be other kinds of memory, such as read-only memory or flash memory. In addition to a hard disk drive (e.g., memory 170), the CVD apparatus 100 in a preferred embodiment includes a floppy disk drive and a card rack (not shown).

The processor 150 operates according to system control software, which includes sets of instructions that dictate the timing, mixture of gases, chamber pressure, chamber temperature, microwave power levels, susceptor position, and other parameters of a particular process. Other computer programs such as those stored on other memory including, for example, a floppy disk or another computer program product inserted in a disk drive or other appropriate drive, may also be used to operate the processor 150 to configure the CVD system 100 into various apparatus.

The processor 150 has a card rack (not shown) that contains a single-board computer, analog and digital input/output boards, interface boards and stepper motor controller boards. Various parts of the CVD system 100 conform to the Versa Modular European (VME) standard which defines board, card cage, and connector dimensions and types. The VME standard also defines the bus structure having a 16-bit data bus and 24-bit address bus.

Figure 4B:
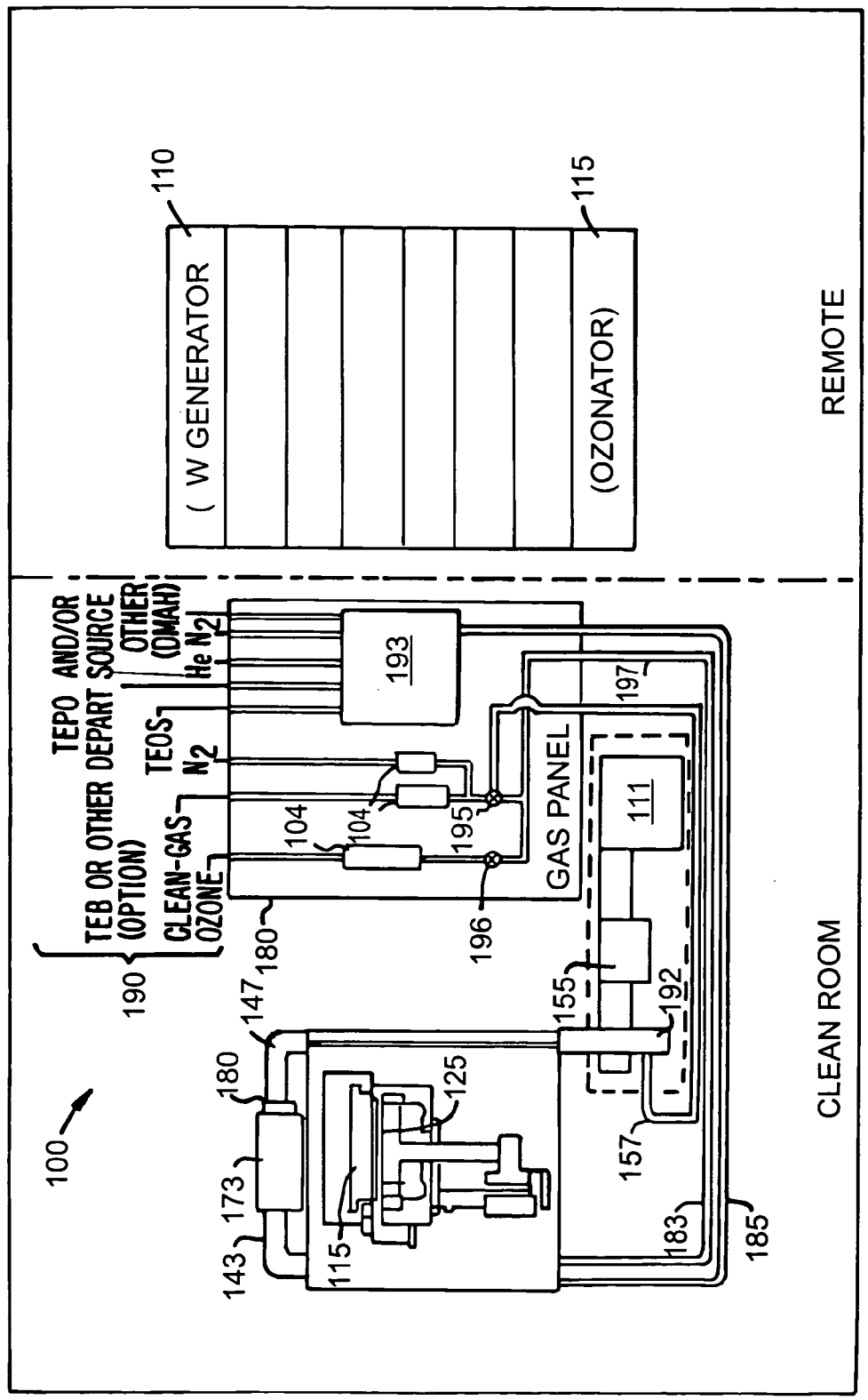
FIG. 4B is a simplified diagram of an exemplary gas panel and supply lines in relation to the substrate processing chamber shown in FIG. 4A.

FIG. 4B illustrates a general overview of an embodiment of the CVD apparatus 100 in relation to a gas supply panel 182 located in a clean room. As discussed above, the CVD system 100 includes a chamber 115 with a heater 125, a gas mixing box 173 with inputs from an inlet tube 143 and a conduit 147, and remote plasma system 155 with input line 157. As mentioned above, the gas mixing box 173 is for mixing and injecting deposition gas(es) and clean gas(es) or other gas(es) through the inlet tube 143 to the processing chamber 115.

The remote plasma system 155 is integrally located and mounted below the chamber 115 with the conduit 147 coming up alongside the chamber 115 to the gate valve 180 and the gas mixing box 173, located above the chamber 115. Plasma generator 110 and ozonator 115 are located remote from the clean room. Supply lines 183 and 185 from the gas supply panel 182 provide reactive gases to the gas supply line 143. The gas supply panel 182 includes lines from gas or liquid sources 190 that provide the process gases for the selected application. The gas supply panel 182 has a mixing system 193 that mixes selected gases before flow to the gas mixing box 173. In some embodiments, gas mixing system 193 includes a liquid injection system for vaporizing reactant liquids such as tetraethylorthosilicate ("TEOS"), triethylborate ("TEB"), and triethylphosphate ("TEPO"). Vapor from the liquids is usually combined with a carrier gas, such as helium. Supply lines for the process gases may include (i) shut-off valves 195 that can be used to automatically or manually shut off the flow of process gas into line 185 or line 157, and (ii) liquid flow meters (LFM) 104 or other types of controllers that measure the flow of gas or liquid through the supply lines.

As an example, a mixture including TEOS as a silicon source may be used with gas mixing system 193 in a deposition process for forming a silicon oxide film. TEOS is a liquid source that may be vaporized by conventional boiler-type or bubbler-type hot boxes. However, a liquid injection system is preferred as it provides greater control of the volume of reactant liquid introduced into the gas mixing system. The liquid is typically injected as a fine spray or mist into the carrier gas flow before being delivered to a heated gas delivery line 185 to the gas mixing block and chamber. One or more sources, such as oxygen ($O_2$) or ozone ($O_3$) flow to the chamber through another gas delivery line 183, to be combined with the reactant gases from heated gas delivery line 185 near or in the chamber. Of course, it is recognized that other sources of dopants, silicon, and oxygen also may be used.

Having fully described several embodiments of the present invention, many other equivalents or alternative embodiments of the present invention will be apparent to those skilled in the art. For example, while the process discussed above with respect to FIG. 1 is for an undoped silica glass (USG) film that may be used, for example, in a shallow trench isolation (STI) application or to isolate adjacent vertical transistors. The techniques of the present invention are useful in depositing other types of high temperature insulating layers and are also useful for other applications. For example embodiments of the invention are useful for depositing doped silica glass layers, the use of which is application dependent, including phosphorous silica glass (PSG), boron-doped silicate glass (BSG) and borophosphosilicate glass (BPSG), and some embodiments of the invention are useful for depositing other dielectric materials and/or depositing dielectric materials for other applications including, premetal dielectric (PMD) layers.

Also, while the embodiment of the invention discussed with respect to FIG. 1 employs a subatmospheric pressure CVD (SACVD) technique, other embodiments of the invention are applicable to the deposition of dielectric materials using other techniques including plasma CVD techniques such as high density plasma chemical vapor deposition (HDP-CVD) techniques. The scope of the invention should, therefore, be determined not with reference to the above description, but instead should be determined with reference to the appended claims along with their full scope of equivalents.

What is claimed is:

1. A method of operating a substrate processing chamber, the method comprising:
   transferring a first substrate into the substrate processing chamber and heating the substrate to a first temperature of at least 510° C.;
   depositing an insulating layer over the first substrate while reducing the temperature of the substrate from the first temperature to a second temperature that is lower than the first temperature;
   transferring the first substrate out of the substrate processing chamber;
   removing unwanted deposition material formed on interior surfaces of the chamber during the depositing step by introducing reactive halogen species into the chamber while increasing the temperature of chamber;
   transferring a second substrate into the substrate processing chamber and heating the substrate to the first temperature; and depositing an insulating layer over the second substrate while reducing the temperature of the substrate from the first temperature to the second temperature;

wherein the insulating layer deposited during each depositing step is deposited within trenches formed for a shallow trench isolation structure on an integrated circuit.

2. The method of claim 1 wherein the second temperature is at least 30° C. lower than the first temperature.

3. The method of claim 1 wherein the second temperature is at least 50° C. lower than the first temperature.

4. The method of claim 1 wherein the temperature of the chamber is increased at least 30° C. during the removing step.

5. The method of claim 1 wherein the insulating layer comprises silicon oxide.

6. The method of claim 1 wherein each depositing step includes first substep of depositing an initial portion of the insulating layer over the first and second substrates, respectively, at the first temperature.

7. The method of claim 1 wherein each depositing step includes first substep of depositing an initial portion of the insulating layer over the first and second substrates, respectively, at the first temperature.

8. A method of operating a substrate processing chamber having a substrate heater, the method comprising:

transferring a first substrate into the substrate processing chamber and heating the heater to a first set point that causes the substrate to be heated to a first temperature of at least 510° C.;

depositing an insulating layer over the first substrate while reducing the temperature of the heater to a second set point thereby reducing the temperature of the substrate from the first temperature to a second temperature that is lower than the first temperature;

transferring the first substrate out of the substrate processing chamber;

removing unwanted deposition material formed on interior surfaces of the chamber during the depositing step by introducing reactive halogen species into the chamber while increasing the temperature of the heater from a third set point that is lower than the first set point to a fourth set point that is lower than the first set point;

transferring a second substrate into the substrate processing chamber and heating the heater to the first set point substrate to the first temperature; and depositing an insulating layer over the second substrate while reducing the temperature of the substrate from the first temperature to the second temperature;

wherein the insulating layer comprises silicon oxide deposited from a process gas comprising ozone and TEOS.

9. The method of claim 8 wherein the silicon oxide layer is doped with phosphorus.

10. A method of operating a substrate processing chamber having a substrate heater, the method comprising:

transferring a first substrate into the substrate processing chamber and heating the heater to a first set point that causes the substrate to be heated to a first temperature of at least 510° C.;

depositing an insulating layer over the first substrate while reducing the temperature of the heater to a second set point thereby reducing the temperature of the substrate from the first temperature to a second temperature that is lower than the first temperature;

transferring the first substrate out of the substrate processing chamber;

removing unwanted deposition material formed on interior surfaces of the chamber during the depositing step by introducing reactive halogen species into the chamber while increasing the temperature of the heater from a third set point that is lower than the first set point to a fourth set point that is lower than the first set point;

transferring a second substrate into the substrate processing chamber and heating the heater to the first set point substrate to the first temperature; and depositing an insulating layer over the second substrate while reducing the temperature of the substrate from the first temperature to the second temperature;

wherein the substrate is heated by a substrate heater embedded in a ceramic pedestal during the removing step.

11. A method of operating a substrate processing chamber having a substrate heater, the method comprising:

transferring a first substrate into the substrate processing chamber and heating the heater to a first set point that causes the substrate to be heated to a first temperature of at least 510° C.;

depositing an insulating layer over the first substrate while reducing the temperature of the heater to a second set point thereby reducing the temperature of the substrate from the first temperature to a second temperature that is lower than the first temperature;

transferring the first substrate out of the substrate processing chamber;

removing unwanted deposition material formed on interior surfaces of the chamber during the depositing step by introducing reactive halogen species into the chamber while increasing the temperature of the heater from a third set point that is lower than the first set point to a fourth set point that is lower than the first set point;

transferring a second substrate into the substrate processing chamber and heating the heater to the first set point substrate to the first temperature; and depositing an insulating layer over the second substrate while reducing the temperature of the substrate from the first temperature to the second temperature;

wherein the insulating layer deposited during each depositing step is deposited within trenches formed for a shallow trench isolation structure on an integrated circuit.

12. The method of claim 11 wherein the second temperature is at least 30° C. lower than the first temperature.

13. The method of claim 11 wherein the second temperature is at least 50° C. lower than the first temperature.

14. The method of claim 11 wherein the temperature of the chamber is increased at least 30° C. during the removing step.

15. The method of claim 11 wherein the insulating layer comprises silicon oxide.

16. A method of operating a substrate processing chamber of the type used to fabricate integrated circuits, the method comprising:

transferring a first substrate into the substrate processing chamber;

depositing a silicon oxide film over the first substrate by introducing TEOS and ozone gases into the chamber and maintaining the chamber at a pressure of between about 45 to 700 Torr, wherein the depositing step includes forming a first portion of the silicon oxide film while heating the substrate to a temperature of at least 510° C. using a substrate heater and forming a second portion of the silicon oxide film over the first portion while reducing the temperature of the substrate;

transferring the substrate out of the chamber;

thereafter, removing unwanted deposition material from interior surfaces of the chamber by introducing a fluorine-containing etchant gas into the chamber;

during the removing step, ramping up the temperature of the substrate heater to increase the chamber temperature;

transferring a second substrate into the substrate processing chamber; and depositing a silicon oxide film over the second substrate disposed by introducing TEOS and ozone gases into the chamber and maintaining the chamber at a pressure of between about 45 to 700 Torr, wherein the depositing step includes forming a first portion of the silicon oxide film while heating the substrate to a temperature of at least 510° C. using a substrate heater and forming a second portion of the silicon oxide film over the first portion while reducing the temperature of the substrate.

17. The method of claim 16 wherein the second temperature is at least 30° C. lower than the first temperature.

18. The method of claim 16 wherein the second temperature is at least 50° C. lower than the first temperature.

19. The method of claim 17 wherein the temperature of the chamber is increased at least 30° C. during the removing step.

20. The method of claim 19 wherein during each depositing step the deposited silicon oxide layer is doped with phosphorus.

21. The method of claim 19 wherein the substrate is heated by a substrate heater embedded in a ceramic pedestal during the removing step.

22. The method of claim 19 wherein the silicon oxide layer deposited during each depositing step is deposited within trenches formed for a shallow trench isolation structure on an integrated circuit.

23. A method of operating a substrate processing chamber having at least interior surface comprising one aluminum, aluminum oxide or aluminum nitride, the method comprising:

transferring a first substrate into the substrate processing chamber;

depositing a dielectric layer over the first substrate using a high temperature chemical vapor deposition in which the substrate reaches a peak temperature of at least 510° C. and at the conclusion of the depositing step the temperature of the substrate is reduced from the peak temperature to a second temperature that is at least 30° C. lower than the peak temperature, wherein the depositing step results in unwanted dielectric material being deposited on the least one interior surface of the chamber;

transferring the first substrate out of the substrate processing chamber;

thereafter, removing the unwanted deposition material formed on the at least one interior surface of the chamber during the depositing step by introducing reactive fluorine species into the chamber;

thereafter, transferring a second substrate into the substrate processing chamber; and depositing a dielectric layer over the second substrate using a high temperature chemical vapor deposition in which the substrate reaches a peak temperature of at least 510° C. and at the conclusion of the depositing step the temperature of the substrate is reduced from the peak temperature to a second temperature that is at least 30° C. lower than the peak temperature.

24. The method of claim 23 wherein the temperature of chamber is increased during the step of removing the unwanted deposition material formed on the at least one interior surface of the chamber.

25. The method of claim 23 wherein during each of the steps of depositing a dielectric layer the temperature of the substrate reaches a peak temperature of at least 540° C. and the temperature of the substrate at the conclusion of the depositing step is reduced from the peak temperature to a second temperature that is at least 50° C. lower than the peak temperature.

26. The method of claim 25 wherein the dielectric layer deposited over the first and second substrates comprises a silicon oxide material.

27. A method of operating a substrate processing chamber, the method comprising:

transferring a first substrate into the substrate processing chamber and heating the substrate to a first temperature of at least 510° C.;

depositing an insulating layer over the first substrate while reducing the temperature of the substrate from the first temperature to a second temperature that is lower than the first temperature;

transferring the first substrate out of the substrate processing chamber;

removing unwanted deposition material formed on interior surfaces of the chamber during the depositing step by introducing reactive halogen species into the chamber while increasing the temperature of chamber;

transferring a second substrate into the substrate processing chamber and heating the substrate to the first temperature; and depositing an insulating layer over the second substrate while reducing the temperature of the substrate from the first temperature to the second temperature, wherein the substrate processing chamber includes at least one component comprising aluminum, aluminum oxide or aluminum nitride that has a surface upon which unwanted deposition material is formed during each of the depositing steps.

28. A method of operating a substrate processing chamber having a substrate heater, the method comprising:

transferring a first substrate into the substrate processing chamber and heating the heater to a first set point that causes the substrate to be heated to a first temperature of at least 510° C.;

depositing an insulating layer over the first substrate while reducing the temperature of the heater to a second set point thereby reducing the temperature of the substrate from the first temperature to a second temperature that is lower than the first temperature;

transferring the first substrate out of the substrate processing chamber;

removing unwanted deposition material formed on interior surfaces of the chamber during the depositing step by introducing reactive halogen species into the chamber while increasing the temperature of the heater from a third set point that is lower than the first set point to a fourth set point that is lower than the first set point;

transferring a second substrate into the substrate processing chamber and heating the heater to the first set point substrate to the first temperature; and depositing an insulating layer over the second substrate while reducing the temperature of the substrate from the first temperature to the second temperature, wherein the substrate processing chamber includes at least one component comprising aluminum, aluminum oxide or aluminum nitride that has a surface upon which unwanted deposition material is formed during each of the depositing steps.

29. A method of operating a substrate processing chamber of the type used to fabricate integrated circuits, the method comprising:

transferring a first substrate into the substrate processing chamber;

depositing a silicon oxide film over the first substrate by introducing TEOS and ozone gases into the chamber and maintaining the chamber at a pressure of between about 45 to 700 Torr, wherein the depositing step includes forming a first portion of the silicon oxide film while heating the substrate to a temperature of at least 510° C. using a substrate heater and forming a second portion of the silicon oxide film over the first portion while reducing the temperature of the substrate;

transferring the substrate out of the chamber;

thereafter, removing unwanted deposition material from interior surfaces of the chamber by introducing a fluorine-containing etchant gas into the chamber;

during the removing step, ramping up the temperature of the substrate heater to increase the chamber temperature;

transferring a second substrate into the substrate processing chamber; and depositing a silicon oxide film over the second substrate disposed by introducing TEOS and ozone gases into the chamber and maintaining the chamber at a pressure of between about 45 to 700 Torr, wherein the depositing step includes forming a first portion of the silicon oxide film while heating the substrate to a temperature of at least 510° C. using a substrate heater and forming a second portion of the silicon oxide film over the first portion while reducing the temperature of the substrate, wherein the substrate processing chamber includes at least one component comprising aluminum, aluminum oxide or aluminum nitride that has a surface upon which unwanted deposition material is formed during each of the depositing steps.

* * * * *